United States Patent [19]

Nonaka et al.

[11] 4,007,473

[45] Feb. 8, 1977

[54] TARGET STRUCTURES FOR USE IN PHOTOCONDUCTIVE IMAGE PICKUP TUBES AND METHOD OF MANUFACTURING THE SAME

[75] Inventors: Yasuhiko Nonaka, Mobara; Tadaaki Hirai, Koganei; Naohiro Goto, Machida; Keiichi Shidara, Tama, all of Japan

[73] Assignees: Hitachi, Ltd.; Nippon Hoso Kyokai, both of Tokyo, Japan

[22] Filed: May 23, 1975

[21] Appl. No.: 580,539

[30] Foreign Application Priority Data

June 21, 1974 Japan .............................. 49-70213

[52] U.S. Cl. .................................... 357/31; 357/16; 357/30; 148/175

[51] Int. Cl.² .......................................... H01L 27/14

[58] Field of Search ......................... 357/31, 30, 16; 148/175

[56] References Cited

UNITED STATES PATENTS

| | | | |
|---|---|---|---|
| 3,755,002 | 8/1973 | Hirai | 148/1.5 |
| 3,800,194 | 3/1974 | Maruyama | 317/235 R |

*Primary Examiner*—Martin H. Edlow
*Attorney, Agent, or Firm*—Charles E. Pfund

[57] ABSTRACT

In a target structure for use in a photoconductive image pickup tube, a P-type photoconductive film is deposited on an N-type transparent conductive film which is deposited on a transparent substrate. The P-type photosensitive film comprises first and second photoconductive substances. The commencement of the deposition of the first photoconductive substance is delayed a predetermined time from that of the second photoconductive substance thereby forming a film of the first photoconductive substance which is not contiguous to the junction surface between the N-type transparent conductive film and the P-type photoconductive film.

17 Claims, 10 Drawing Figures

TARGET STRUCTURES FOR USE IN PHOTOCONDUCTIVE IMAGE PICKUP TUBES AND METHOD OF MANUFACTURING THE SAME

BACKGROUND OF THE INVENTION

This invention relates to a target structure for use in a photoconductive image pickup tube and more particularly to a target structure including a heterojunction and utilized in a vidicon or photoconductive image pickup tube and a method of manufacturing the same.

As an image pickup tube including a target which utilizes a non-crystalline photoconductive film, a vidicon has been known which includes an ohmic junction utilizing a film of antimony trisulfide.

Recently, an image pickup tube including a photoconductive target which utilizes a non-crystalline photoconductive film wherein use is made of a heterojunction between a P-type photoconductive film containing selenium and an intensifier such as tellurium, and an N-type conductive film has been proposed.

The image pickup tube of this type is characterized in that it has a wide range of spectrum sensitivity, fast response time, low dark current and a high resolution, and that it is easy to manufacture.

Typically, the target structure of the image pickup tube having these characteristics is constructed such that a transparent conductive film consisting essentially of indium oxide or stannic oxide having N-type conductivity is coated on the rear surface of a glass substrate or a glass window that transmits the incident light rays to the image pickup tube and that a P-type photoconductive film comprising selenium, less than 30 atomic % of tellurium, and less than 30 atomic % of arsenic, for example, a P-type photoconductive film comprising a mixture of a first photoconductive substance consisting of selenium and less than 40 atomic % of tellunium and a second photoconductive substance consisting of selenium and 10 atomic % of arsenic is deposited on the rear surface of the N-type transparent conductive film through a heterojunction surface.

According to another type, an N-type transparent semiconductor film is formed on the rear side of said N-type transparent conductive film by the vapour deposition of cadmium selenide, cadmium sulfide, zinc sulfide, gallium arsenic, germanium or silicon and said P-type photoconductive film is formed on the rear surface of the N-type transparent semiconductive film through a heterojunction surface. Furthermore, for the purpose of improving the landing characteristic of an electron beam emitted from an electron beam emitting device on the photoconductive film a porous film of antimony trisulfide ($Sb_2S_3$) is formed on the rear surface of the P-type photoconductive film. In these cases, as will be described later with reference to the accompanying drawings the tellurium in the first photoconductive substance presents throughout the thickness of the P-type photoconductive film and the concentration of the tellurium increases substantially continuously from the heterojunction surface whereas the concentration of the arsenic in the second photoconductive substance is substantially uniform from the heterojunction surface to the P-type photoconductive film and throughout the thickness thereof.

With this construction, the region in which the concentration of tellurium is high and hence having an extremely low specific resistance is located close to the heterojunction surface so that the heterojunction surface is deteriorated and the initial dark current characteristic is greatly impaired. Where the target is stored or left standstill in atmosphere at a temperature higher than 60° C the heterojunction surface is deteriorated to increase the dark current due to a slight diffusion of tellurium. Such variation in the dark current characteristic causes a poor colour balance of a picture picked up by the image pickup tube thus degrading the quality of the picture.

Moreover, since tellurium has a larger tendency of crystallization under heat than selenium, it hastens crystallization of the P-type photoconductive film thus causing local decrease of the film resistance. As a result, defects in the form of white spots are formed in the picture thereby greatly decreasing the quality of the picture.

SUMMARY OF THE INVENTION

Accordingly, it is an object of this invention to provide an improved target structure for use in a photoconductive image pickup tube which has a stable and small dark current characteristic.

Another object of this invention is to provide a novel photoconductive image pickup tube which can operate under a low operating voltage and easy to handle. Still another object of this invention is to provide a target structure for use in a photoconductive image pickup tube having an improved thermal characteristic.

A further object of this invention is to provide a novel target structure for use in an image pickup tube having an improved spectrum sensitivity characteristic over a wide range.

According to one aspect of this invention, there is provided a target structure for use in a photoconductive image pickup tube of the type comprising a transparent substrate, an N-type transparent conductive film deposited on the rear side of the substrate, and a P-type photoconductive film on the rear side of the N-type transparent conductive film via a heterojunction surface and containing selenium as an intensifier, characterized in that the starting point of the intensifier containing portion of the P-type photoconductive film is located in a predetermined range spaced in the direction of thickness thereof from the heterojunction between the P-type photoconductive film and the N-type conductive layer.

According to another aspect of this invention, there is provided a method of manufacturing a target structure for use in an image pickup tube, characterized by the steps of preparing a transparent substrate, depositing an N-type transparent conductive film on one surface of the substrate, depositing at a substantially constant speed on the N-type conductive film a second photoconductive substance which constitutes a P-type photoconductive film, and commencing at a continuously varying speed deposition of a first photoconductive substance which constitutes the P-type photoconductive film at a time later than the commencement of the deposition of the second photoconductive substance while the second photoconductive substance is being deposited.

The N-type transparent conductive film comprises indium oxide, stannic oxide, mixture of indium oxide with stannic oxide, or mixture of stannic oxide with antimony.

The P-type photoconductive film comprises a first photoconductive substance consisting of selenium containing tellurium and a second photoconductive substance consisting of selenium containing arsenic, preferably the content of tellurium being less than 30 atomic % and that of arsenic less than 30 atomic %. The concentration distribution of arsenic is substantially uniform over the entire thickness of the P-type photoconductive film whereas the concentration of tellurium is localized near the heterojunction surface.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1A:
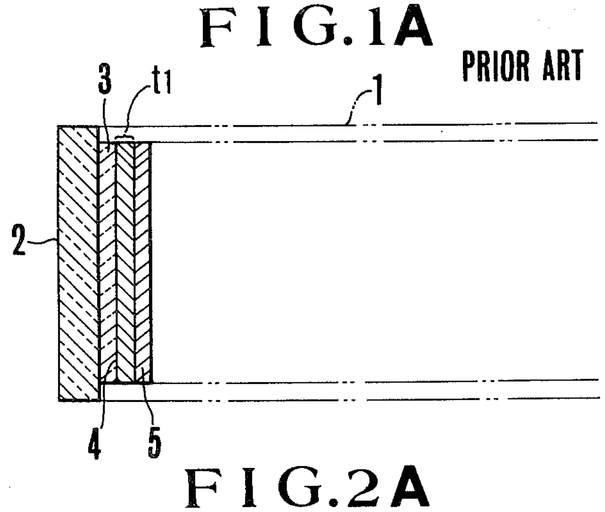
FIG.1A PRIOR ART
FIG. 1A and FIG. 1A' are diagrammatic representations showing the constructions of the prior art target structures for use in photoconductive image pickup tubes.

As diagrammatically shown by FIG. 1A, a prior art target structure generally designated by a reference numeral 1 for use in a photoconductive image pickup tube comprises a transparent substrate 2 sealed to the front surface of the pickup tube, not shown. An N-type transparent conductive film 3 is provided for the rear surface of the substrate 2 and a P-type photoconductive film 5 is formed on the back of the film 3. A heterojunction surface 4 is formed between the N-type transparent conductive film 3 and the P-type photoconductive film 5. The N-type transparent conductive film 3 comprises indium oxide, stannic oxide, mixture of indium oxide with stannic oxide, or mixture of stannic oxide with antimony. The P-type photoconductive film 5 preferably comprises selenium, less than 30 atomic % tellurium and less than 30 atomic % arsenic.

Figure 1A:
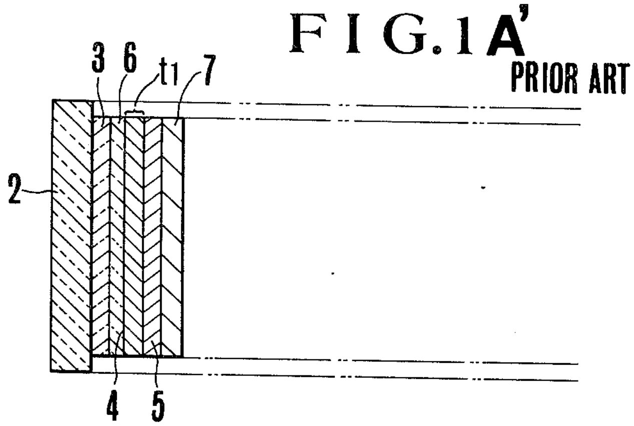
FIG.1A' PRIOR ART
Figure 1B:
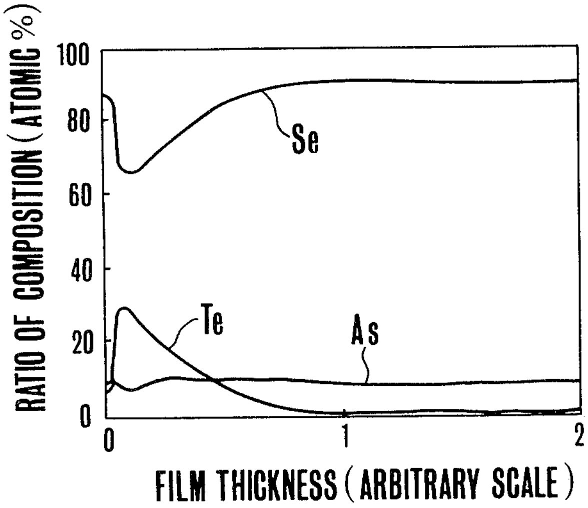
FIG. 1B is a graph showing the distribution of the composition of the P-type photoconductive film utilized in the target structures shown in FIGS. 1A and 1A'.

Another prior art target structure shown in FIG. 1A' comprises the transparent substrate 2, N-type transparent conductive film 3 formed on the back of the substrate 2, an N-type transparent semiconductor film 6 formed on the back of the N-type transparent conductive film 3 and comprising an element selected from the group consisting of cadmium selenide, cadmium sulfide, zinc sulfide, gallium arsenic, germanium and silicon P-type photoconductive film 5 on the back of the N-type transparent semiconductive film 6 and a semiporous film 7 of antimony trisulfide $Sb_2S_3$ on the rear side of the P-type photoconductive film 5. The N-type transparent semiconductive film 6 contributes to reduction of the dark current during operation and reduction of the white spot. The semiporous film 7, as mentioned previously, contributes to improvement in the landing characteristic of electron beams. Although not illustrated, simple modifications are possible wherein the semiporous film 7 is incorporated into the target structures shown in FIGS. 1A and 2A in the same manner as FIGS. 1A' and 2A'. A heterojunction surface 4 is formed at the interface between the N-type transparent semiconductive film 6 and the P-type photoconductive film 5. The P-type photoconductive film 5 comprises a mixture of a first photoconductive substance consisting of selenium and 40 atomic % of tellurium and a second photoconductive substance consisting of selenium and 10 atomic % of arsenic, for example. However, the tellurium is not uniformly distributed throughout the thickness but concentrates in a layer having a thickness of $t_1$. More particularly, as shown in FIG. 1B, although the tellurium distributes throughout the thickness, the concentration of tellurium is the highest in the region $t_1$ shown in FIG. 1A. More noticeable is the fact that the region $t_1$ is contiguous to the heterojunction surface 4. For this reason, the prior art target structures had a number of difficulties as has been pointed out in the foregoing description.

According to one example of the prior art method of manufacturing the target of an image pickup tube provided with a heterojunction of the constructon described above, the transparent conductive film consisting essentially of indium oxide or stannic oxide having N-type conductivity is formed on the transparent substrate 2. Then the first and second photoconductive substances are prepared independently and pulverized. Then the powders thereof are contained in separate tantalum evaporation boats and evaporated simultaneously to form the P-type photoconductive film. During vapour deposition, the currents flowing through respective boats are controlled such that the speed of vapour deposition of the first photoconductive substance is varied while that of the second photoconductive substance is maintained at a constant value so that the content of tellurium will be less than 10 atomic % at both interfaces of the P-type photoconductive film and at a maximum concentration of 10 to 40 atomic % at a position near the N-type conductive film than at the central position inside the film, as shown in FIG. 1B.

Figure 2A:
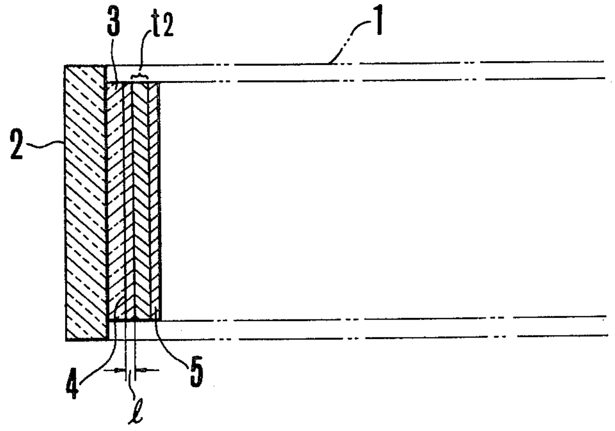
FIGS. 2A and 2A' are diagrammatic sectional views of the target structures embodying the invention.
Figure 2A:
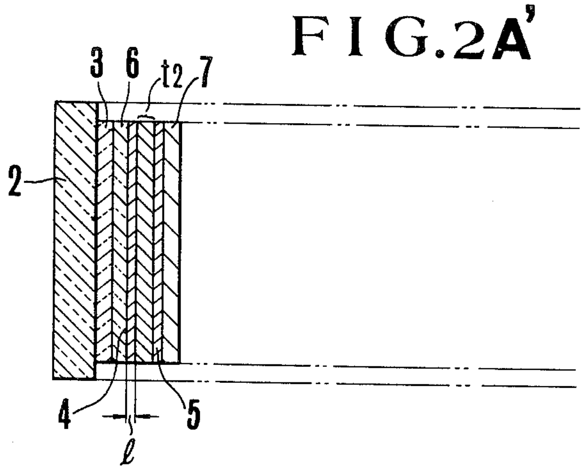

FIGS. 2A and 2A' diagrammatically show the construction of the targets of an image pickup tube embodying the invention, in which portions corresponding to those shown in FIGS. 1A and 1A' are designated by the same reference numerals.

Figure 2B:
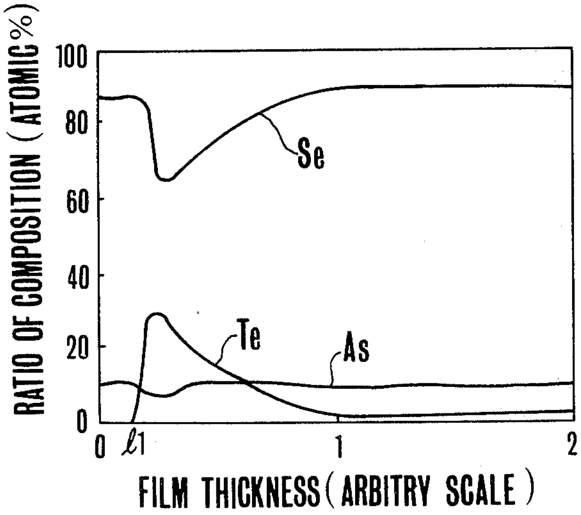
FIG. 2B is a graph showing the distribution of the composition of the P-type photoconductive film of the target structures shown in FIGS. 2A and 2A'.

FIGS. 2A and 2A' are different from FIGS. 1A and 1A' in that in FIGS. 2A and 2A', the region $t_2$ which corresponds to the region $t_1$ in which the concentration of tellurium is high is not contiguous to the heterojunction surface 4. More particularly, the starting point of the region $t_2$ is spaced by $l$ from the heterojunction surface 4. If the spacing $l$ is selected to be from 80 A to 1500 A, various advantages as will be described later in detail could be obtained. The concentration distribution in the direction of the thickness of the composition of the P-type photoconductive film 5 of the target used in the image pickup tube shown in FIGS. 2A and 2A' is shown in FIG. 2B. It should be particularly noted that the starting point of the distribution of tellurium is not located at a zero point of the thickness. In this case, the thickness of the P-type photoconductive film ranges from about 2 to 10 microns.

Figure 3:
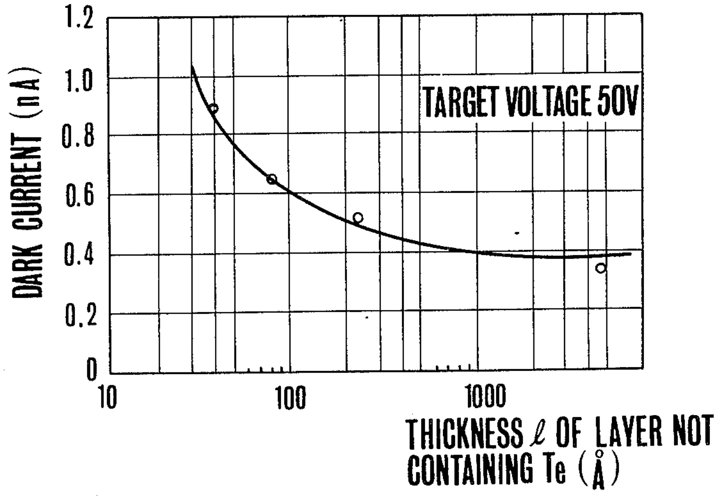
FIGS. 3 through 6 show various characteristics of a photoconductive image pickup tube utilizing the target structure embodying the invention.

FIG. 3 shows variations in the dark current of the target utilized in a photoconductive image pickup tube when the thickness $l$ of a layer which is formed at an early stage of manufacturing the P-type photoconductive film and not yet containing tellurium is varied over a range of values. As can be noted from FIG. 3, where the thickness of the layer $l$ not containing tellurium is equal to more than 200 A, in other words, where the starting point of a tellurium containing layer is located 200 A apart from the heterojunction surface, the dark current is extremely small and steady whereby a target having a dark current characteristic of a steady and small value can readily be obtained. A spacing exceeding 80 A results in a quite satisfactory target.

Figure 4:
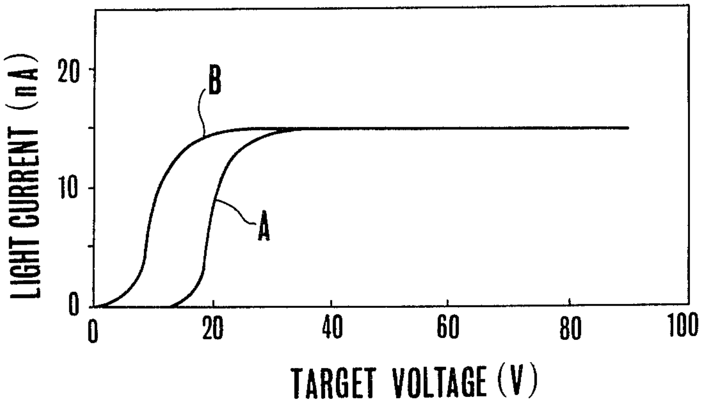

FIG. 4 is a graph showing the relationship between the target voltage and the variation in the photocurrent when the target is irradiated with blue light of short wavelength in which curve A shows a case wherein the thickness of the layer not containing tellurium is 0A (a tellurium containing layer is contiguous to the heterojunction surface), curve B shows a case wherein the thickness of the layer not containing tellurium is equal to 80 A. In both cases A and B, the photocurrent saturates as the target voltage (the voltage impressed upon the P-type photoconductive film through a terminal not shown) increases but as the thickness of the layer not containing tellurium of case B increases, the saturation voltage of the target decreases. The higher is the saturation voltage the higher is the operating voltage of the image pickup tube thus rendering it more difficult to handle. This greatly degrades the baking characteristic, one of the characteristics of the target, thus degrading quality of the picture picked up. Accordingly, as the thickness of the layer *l* not containing tellurium increases, the characteristics of the image pickup tube is improved and its handling becomes easier.

Figure 5:
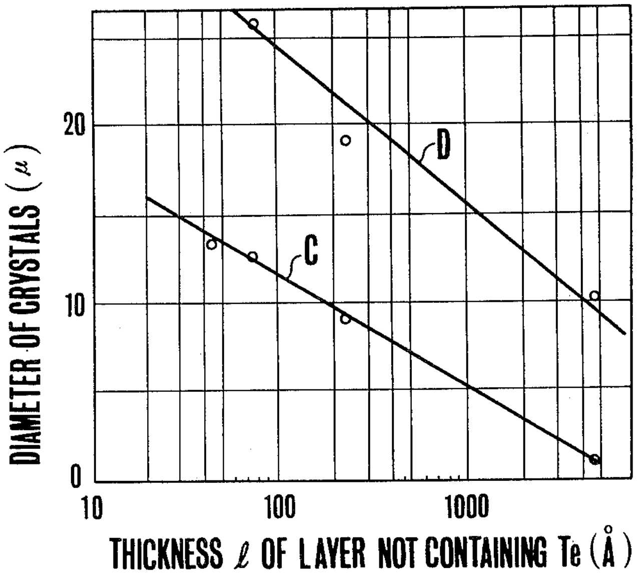

FIG. 5 is a graph showing the relationship between the thickness of the layer *l* not containing tellurium and the diameter of the crystals formed at local positions of the photoconductive film, such relation being a measure of improving the thermal characteristic of the target. The curve C was obtained by maintaining the target at 100° C for 120 minutes while curve D was obtained by maintaining the target at 100° C for 240 minutes. As can be noted from FIG. 5, the thicker the layer *l* not containing tellurium, in other words, the larger the distance between the starting point of the tellurium containing layer and the heterojunction surface, the slower is the speed of growing crystals locally formed in the P-type photoconductive layer. In other words, as the thickness of the layer *l* not containing tellurium increases, crystallization becomes difficult thus improving the thermal characteristic of the target. Such crystallization of the film results in the local variation of the film resistance at the time of operation of the image pickup tube thus causing picture defects in the form of white spots which detrimentally affect the characteristic of the target. For this reason, in order to improve the thermal characteristic, the thickness of the layer *l* not containing tellurium should be increased. As stated above, the graph shown in FIG. 5 was obtained under a temperature of 100° C, but actual operating temperature is less than 40° C in most cases. Each time the temperature varies 10° C, the speed of crystallization increases by a factor of 2 to 10. In any case, in order to improve the thermal characteristic, it is quite sufficient to make the layer *l* not containing tellurium to have a width of more than 200 A. Practically, the layer not containing tellurium of the thickness of more than 80 A is satisfactory.

Figure 6:
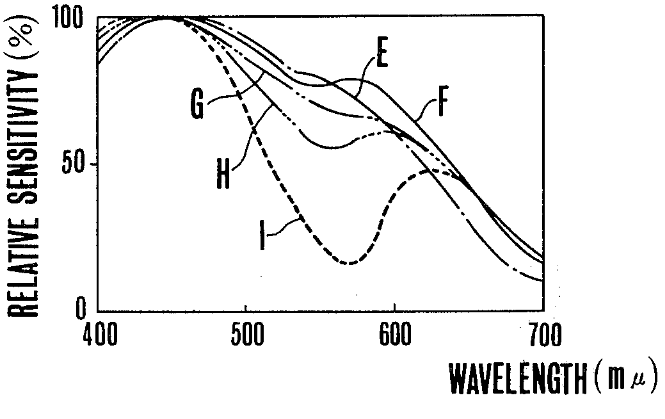

FIG. 6 shows the spectral sensitivity characteristic of the target for varying thickness of the layer *l* not containing tellurium in which E shows a case wherein the thickness of the layer *l* is 80 A, F shows a case in which the thickness of the layer *l* is 220 A and G, H, I show cases in which the thickness of the layer *l* is 1500 A, 3000 A and 7000 A, respectively. As can be clearly noted from FIG. 6 if the thickness of the layer *l* is not containing tellurium were too large (cases H and I) the target manifests irregular spectral sensitivity characteristics in which the sensitivity is improved on the sides of short wavelength and long wavelength in the visible region. However, an image pickup tube is required to have a high spectral sensitivity over a wide range in the visible region whether it is used for monochromatic light or multiple colour light. For practical use, a spectral sensitivity provided by the layer *l* having a thickness of at most 1500 A is required.

As has been described hereinabove with reference to FIGS. 3 to 6 according to this invention, since the starting point of the tellurium containing portion is situated in a range of from 80 A to 1500 A spaced in the direction of the film from the heterojunction surface between the P-type photoconductive film and other film it is possible to stabilize the dark current characteristic of the target of the image pickup tube, to prevent generation of picture defects and to improve the spectral sensitivity characteristic.

A method of manufacturing the target structure for use in an image pickup tube according to this invention will now be described. Since the prior art target structure is not provided with the layer *l* not containing tellurium the first and second conductive substances are vapour deposited at the same time from the instant at which the vapour deposition is commenced. In contrast, according to this invention for the purpose of forming the layer *l* not containing tellurium, vapour deposition of the first photoconductive substance is delayed relative to the commencement of the vapour deposition of the second photoconductive substance.

More particularly, a glass substrate 2 shaped in the form of the incident window of the image pickup tube is prepared and the substrate is cleaned in suitable cleaning liquid for removing dust or foreign substances deposited on the glass substrate. The cleaned glass substrate is mounted in a belljar of a well known vapour deposition device with its one side faced upwardly. An N-type transparent conductive film 3 consisting of indium oxide or stannic oxide is vapour deposited on the glass substrate under a suitable degree of vacuum. It is possible to vapour deposit the N-type transparent conductive film having a predetermined thickness on the glass substrate by controlling the current supplied to an evaporation boat containing the material to be evaporated. Preferably, the thickness of the N-type transparent conductive film ranges from 1200 A to 3500 A. Then the P-type photoconductive film 5 is vapour deposited on the N-type transparent conductive film to a thickness of from about 2 to 10 microns so as to form a heterojunction film therebetween. As FIG. 2B clearly shows, as the second photoconductive substance consisting of selenium and 10 atomic % of arsenic is distributed substantially uniformly throughout the entire thickness of the P-type photoconductive film, vapour deposition is made at substantially a constant speed. This can be accomplished by maintaining constant the current supplied to the evaporation boat (made of tantallum for example) containing a powder of the second photoconductive substance in a manner well known in the art. On the other hand, the first photoconductive material consisting of selenium and 40 atomic % of tellurium, for example, localizes at portions of the P-type photoconductive film having a predetermined thickness so that the first photoconductive substance should be vapour deposited at continuously varying speed. This can be accomplished by the suitable control of the current supplied to the evaporation boat containing the powder of the first photoconductive substance. The first and second photoconductive substances are loaded in independent evaporation boats.

As has been pointed out hereinabove, according to this invention, for the purpose of obtaining a distribution of tellurium as shown in FIG. 2B, the commencement of the vapour deposition of the first photoconductive is delayed relative to that of the second photoconductive substance. To this end, at first the second photoconductive material is deposited on the N-type transparent conductive film as described hereinabove, and this vapour deposition is continued until the P-type photoconductive film builds up to a predetermined thickness. A predetermined time later current is supplied to another evaporation boat loaded with the first photoconductive substance for commencing the vapour deposition thereof. Although this deposition is continued until the P-type photoconductive film builds up to a predetermined thickness, substantially all quantity of the material is deposited at the early stage of the vapour deposition as shown in FIG. 2B. In this manner, a P-type photoconductive film comprising a mixture of the first and second photoconductive substances is formed. For example, where the vapour deposition is commenced by supplying current of 42 A to the evaporation boat containing the second photoconductive substance under a vacuum of $2 \times 10^{-6}$ torr it is possible to obtain a layer not containing tellurium and having a thickness of 80 A to 1500 A by selecting a delay time of 10 to 60 seconds.

The resulting target structure is sealed to one end of the cylindrical envelope of an image pickup tube by means of a sealing agent comprising metallic indium which is used as an intermediate conductive member for an external terminal.

Although in the illustrated embodiment, a P-type photoconductive film was formed on an N-type conductive film and an N-type semiconductive film was interposed between the N-type conductive film and the P-type photoconductive film it should be understood that the invention is by no means limited to such specific construction. Thus for example, where another type N-type photoconductive film is formed by specifying the starting point of the tellurium containing layer with reference to the heterojunction surface at the interface between the P-type photoconductive film and another film, the same advantageous results can also be obtained, so that it is intended to include such modified construction also in the scope of this invention.

In the above description, a method of controlling the current supplied to an evaporation boat containing the first photoconductive substance has been shown for the purpose of localizing the same but a shutter may be provided for the evaporation boat for the purpose of attaining the same object. The use of such shutter is also included in the scope of this invention.

While the invention has been described in its preferred embodiment, it is to be understood that the words which have been used are words of description rather than limitation and that changes within the purview of the appended claims may be made without departing from the scope and spirit of the invention in its broader aspects.

What is claimed is:

1. In a target structure for use in a photoconductive image pickup tube of the type comprising a transparent substrate, an N-type transparent conductive film deposited on the rear side of said substrate, and a P-type photoconductive film deposited on the rear side of N-type transparent conductive film with a heterojunction surface therebetween and said P-type photoconductive film containing at least selenium and tellurium as an intensifier, the improvement wherein the starting point of the intensifier containing portion of said P-type photoconductive film is located in a predetermined range of 80A to 1500A spaced in the direction of thickness thereof from said heterojunction surface.

2. The target structure according to claim 1 wherein said N-type transparent conductive film comprises indium oxide or mixture of indium oxide with stannic oxide.

3. The target structure according to claim 1 wherein said N-type transparent conductive film comprises stannic oxide or mixture of stannic oxide with antimony.

4. The target structure according to claim 1 wherein said P-type photoconductive film comprises a first photoconductive substance consisting of selenium containing tellurium and a second photoconductive substance consisting of selenium containing arsenic.

5. The target structure according to claim 1 wherein said P-type photoconductive film comprises a mixture of less than 30 atomic % of tellurium, less than 30 atomic % of arsenic and selenium.

6. The target structure according to claim 4 wherein the concentration distribution of said arsenic is substantially uniform throughout the thickness of said P-type photoconductive film.

7. The target structure according to claim 6 wherein the concentration distribution of said tellurium localizes near said heterogeneous junction plane.

8. The target structure according to claim 1 wherein the thickness of said P-type photoconductive film ranges from about 2 to 10 microns.

9. The target structure according to claim 1 wherein a semiporous film is formed on the rear surface of said P-type photoconductive film.

10. The target structure according to claim 9 wherein said semiporous film comprises antimony trisulfide.

11. The target structure according to claim 1 which further comprises an N-type transparent semi-conductive film interposed between said N-type transparent conductive film and said P-type photo-conductive film.

12. The target structure according to claim 11 wherein said N-type transparent semiconductive film comprises an element selected from the group consisting of cadmium selenide, cadmium sulfide, zinc sulfide, gallium silicate, germanium and silicon.

13. The target structure according to claim 11 wherein a semiporous film is formed on the rear surface of said P-type photoconductive film.

14. The target structure according to claim 13 wherein said semiporous film comprises antimony trisulfide.

15. A method of manufacturing a target structure for use in an image pickup tube comprising the steps of preparing a transparent substrate, depositing an N-type transparent conductive film on one surface of said substrate, depositing at a substantially constant speed on said N-type conductive film a second photoconductive substance which constitutes a P-type photoconductive film forming a heterojunction, and commencing the deposition at a continuously varying speed of a first photoconductive substance which constitutes said P-type photoconductive film with an intensifier at a time later than the commencement of the deposition of said second photoconductive substance while said second photoconductive substance is being deposited to space said first photoconductive substance 80A to 1500A from said heterojunction.

16. The method according to claim 15 wherein said P-type photoconductive film is formed by a first photoconductive substance consisting of selenium containing tellurium and a second photoconductive substance consisting of selenium containing arsenic.

17. The method according to claim 16 wherein said P-type photoconductive film comprises selenium, less than 30 atomic % of tellurium and less than 30 atomic % of arsenic.

* * * * *